United States Patent [19]

Mimura et al.

[11] 4,367,200

[45] Jan. 4, 1983

[54] SINGLE CRYSTAL MANUFACTURING DEVICE

[75] Inventors: Yoshinori Mimura; Yoshihisa Komazawa; Yasuyuki Okamura, all of Tokyo, Japan

[73] Assignee: Kokusai Denshin Denwa Kabushiki Kaisha, Japan

[21] Appl. No.: 227,682

[22] Filed: Jan. 23, 1981

[30] Foreign Application Priority Data

Jan. 30, 1980 [JP] Japan .................................. 55-8741

[51] Int. Cl.³ ...................... C30B 15/02; C30B 15/08; C30B 35/00
[52] U.S. Cl. .................................... 422/248; 422/249; 156/617 V; 156/617 SP; 156/DIG. 96
[58] Field of Search .................... 422/246, 248, 249; 156/DIG. 96, 617 V, 617 SP, 608; 65/3.13, 204, 61

[56] References Cited

U.S. PATENT DOCUMENTS 2,992,517 7/1961 Hicks, Jr. ..................... 156/DIG. 96
3,393,054 7/1968 Rupprecht et al. ......... 156/DIG. 96
4,108,714 8/1978 Keller et al. ................ 156/DIG. 96
4,267,153 5/1981 Taylor .......................... 156/617 SP Primary Examiner—Gregory N. Clements
Attorney, Agent, or Firm—Robert E. Burns; Emmanuel J. Lobato; Bruce L. Adams

[57] ABSTRACT

A single crystal manufacturing device, in which there are provided a crucible having a melting part for holding a molten liquid of a raw material and a nozzle part for continuously taking out a predetermined amount of the molten liquid by the action of gravity; a heater for heating the raw material to melt it in the melting part; and temperature control means for heating the nozzle part to take out the molten liquid of the raw material from the nozzle part and for providing as large a thermal gradient as possible in the solid-liquid interface between the molten liquid taken out from the nozzle part and a grown single crystal continuous to the molten liquid.

The crucible can be double-structured. A guide pipe filled with fibrous material may be provided between the nozzle and the rollers of the grown single crystal.

2 Claims, 3 Drawing Figures

SINGLE CRYSTAL MANUFACTURING DEVICE

FIELD OF THE INVENTION

The present invention relates to a manufacturing device for growing a single crystal from a molten liquid and, more particularly, to a single crystal manufacturing device for continuously growing a single crystal while controlling its outward shape.

BACKGROUND OF THE INVENTION

This type of device heretofore employed is an EFG method (Edge defined Film fed Growth method), in which a molten liquid in a crucible, molten by a heater, is caused to raise up to the upper end portion of a die by the capillary action of a capillary tube disposed centrally of the die and the molten liquid is pulled up to the upper end face of the die, thereby manufacturing a single crystal of a configuration defined by the outward shape of the upper end portion of the die. The greatest feature of the EFG method is to guide the molten liquid up to the upper end portion of the die through utilization of the capillary action, as described above.

This method has an advantage such that a constant amount of molten liquid, which is substantially dependent on the wetting property between the molten liquid and the die, can be stably supplied to the solid-liquid interface, but this leads to such a defect that the above method is limited to only specific combinations of materials of the molten liquid and the die. That is, for the application of the EFG method, it is necessary that the materials of the molten liquid and the die satisfy both of two conditions that (1) they are wettable of each other enough to cause a sufficient rise of the molten liquid by the capillary action, and that (2) they do not chemically react with each other. In practice, however, combinations of materials which satisfy the abovesaid conditions (1) and (2) at the same time are very few; namely, there are known only two or three combinations such as sapphire (molten liquid) and molybdenum and tungsten (die), silicon (molten liquid) and graphite (die), and so forth. In particular, in connection with chemically active molten liquids of halides other than oxides, it is very difficult to find a combination of materials of the die and the molten liquid which meet with both the abovementioned requirements (1) and (2).

A second shortcoming of the EFG method resides in that the melting of the raw material in the crucible and the temperature control of the upper end portion of the die for growing the single crystal in an optimum condition must be performed by a single heater. In the EFG method, the molten liquid is supplied to the upper end portion of the die through utilization of the rise of the molten liquid by the capillary action, but usually the rise of the liquid by the capillary action is not so large. Accordingly, the upper end portion of the die is not spaced very far apart from the molten liquid level, so that difficulties are encountered in controlling the temperature of the upper end portion of the die independently of the influence of the raw material melting heater. The most serious defect which results from using the single heater both for controlling the temperature of the upper end portion of the die and for melting the raw material lies in that the diameter of the heater is too large to provide a steep thermal gradient on the upper end portion of the die. The upper limit of the growing rate of the single crystal depends on the cooling rate of the molten liquid and, for raising the cooling rate, it is indispensable to make the thermal gradient in the vicinity of the solid-liquid interface steep. In the EFG method, however, it is difficult to provide a steep thermal gradient in the neighborhood of the solid-liquid interface, and consequently a high growing rate cannot be expected.

Still another defect, which accompanies the use of the rise of the molten liquid by the capillary action for the molten liquid supply as in the EFG method, is a fact that the amount of the molten liquid supplied to the solid-liquid interface is substantially determined unequivocally by the properties of the die and the molten liquid in principle. Accordingly, in a case of manufacturing a crystal that is large as compared with the diameter of the capillary tube employed for supplying the molten liquid, or for growing a crystal at a high growing rate, the limit of the growing rate is determined by the amount of molten liquid supplied before reaching the limit of the growing rate dependent on a thermal equilibrium condition which is determined by the cooling rate.

SUMMARY OF THE INVENTION

To avoid the abovesaid defects of the prior art, an object of the present invention is to provide a single crystal manufacturing device which supplies the molten liquid to the solid-liquid interface by the weight of the molten liquid itself in place of the capillary action, and which is provided with a capillary tube part for defining the amount of molten liquid to be supplied, a nozzle for defining the outer diameter of the single crystal, a heater for providing a steep thermal gradient in the solid-liquid interface and raw material supply means for holding the amount of molten liquid constant and continuously growing the single crystal.

BRIEF DESCRIPTION OF THE ACCOMPANYING DRAWINGS

The principle, construction and operation of the present invention will be clearly understood from the following detailed description taken in conjunction with the accompanying drawings, in which:

FIGS. 1 and 2 are longitudinal sectional views each illustrating the construction of single crystal manufacturing devices of the present invention; and FIG. 3 is a modification of the embodiment shown in FIG. 1.

DETAILED DESCRIPTION OF THE INVENTION

Figure 1:
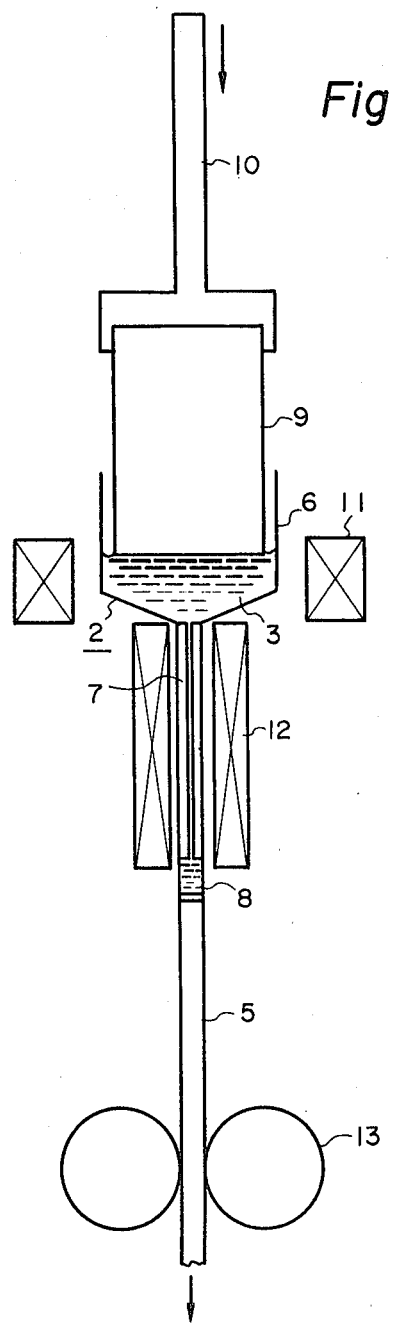

With reference to FIG. 1 showing an embodiment of this invention, a crucible 2 comprises a raw material melting part 6, a capillary tube part 7 for defining the amount of molten liquid to be supplied to the solid-liquid interface and a nozzle part 8 for defining the outward shape of a single crystal. Reference numeral 9 indicates a raw material to be supplied; 10 designates raw material supply means; 11 identifies a heater for melting the raw material; 12 denotes a heater for controlling the temperature of the nozzle part 8; and 13 represents rollers for lowering a grown single crystal at a constant speed.

With the arrangement of the present invention, the single crystal is manufactured in the following manner. The raw material 9 stored in the raw material supply means 10 is melted by the heater 11 in the raw material melting part 6. The molten liquid 3 passes through the capillary tube 7 by the weight of the molten liquid 3 itself and reaches the tip of the nozzle part 8 given a very steep thermal gradient and then the molten liquid 3 is cooled into a single crystal. The single crystal 5 thus grown is transferred by the rollers 13 in a direction of the arrow at a constant speed. In this case, it is necessary that the amount of single crystal to be precipitated and the amount of the raw material 9 to be supplied be adjusted to coincide with the flow quantity of the molten liquid 3 passing through the nozzle part 8. The raw material 9 need not always be solid as shown in FIG. 1 but may also be in the form of a molten liquid or powder.

The amount of molten liquid passing through the nozzle 8 is determined by the capillary tube part 7 on the basis of the following principles. In general, the flow quantity Q of a liquid passing through a capillary tube is given by $Q = (\pi R^4 / 8 \mu l)(P_1 - P_2)$, where R is the radius of the capillary tube, l is the length of the capillary tube, $\mu$ is the viscosity of the liquid and $(P_1 - P_2)$ is a pressure difference between both ends of the capillary tube. Since the inner diameter of the capillary tube part 7 is usually far smaller than the inner diameters of the nozzle part 8 and the raw material melting part 6, the flow quantity of the liquid is approximately in proportion to the fourth power of the inner diameter of the capillary tube part and is in reverse proportion to the length of the capillary tube part. Accordingly, an arbitrary flow quantity can be obtained by suitably selecting the inner diameter and the length of the capillary tube part. For example, in a case of using KRS-5 (thallium bromide iodide) molten liquid, when the inner diameter and the length of the capillary tube part 7 were selected to be 100 m and 3 cm, respectively, a flow rate of 1.5 cm/min could be obtained in the nozzle part 1 mm in inner diameter. The capillary tube part may be located at any position between the raw material melting part 6 and the tip of the nozzle part 8. The distance between the raw material melting part 6 and the tip of the nozzle part 8 is selected such that the influence of the heater 11 for raw material melting use is not exerted on the tip of the nozzle part 8. With such an arrangement, since the temperature at the tip of the nozzle part 8 can be controlled by the small-diameter heater 12, a steep temperature gradient can be provided at the tip of the nozzle part, and accordingly a high crystal growth rate can be obtained. This effect can be heightened by forming the nozzle part 8 and the capillary tube part 7 of a metal of good thermal conductivity such, for example, as gold. In this case, since the tip of the nozzle part 8 is heated by thermal conduction of the metal, it can be positioned below the lower end of the heater 12 for controlling the temperature of the nozzle part, making it possible to provide a sufficiently steep temperature gradient.

The shape of the tip of the nozzle part need not always be round but may also be square or any other desired shape and by forming the tip of the nozzle part to have a shape corresponding to a desired outside shape of the single crystal, it is possible to obtain the single crystal of the desired outside shape.

When it is necessary to keep constant the outer diameter of the single crystal to be obtained or to continuously manufacture a long crystal, the raw material 9 is supplied by the raw material supply means 10 by an amount which coincides with the flow quantity of the molten liquid. This maintains the amount of molten liquid constant at all times, ensuring prevention of variations in the flow quantity of the molten liquid with fluctuations in the weight of the molten liquid. When it is not necessary to control a change in the outer diameter of the single crystal or to continuously grow the single crystal, the raw material supply means 10 need not be provided.

Figure 2:
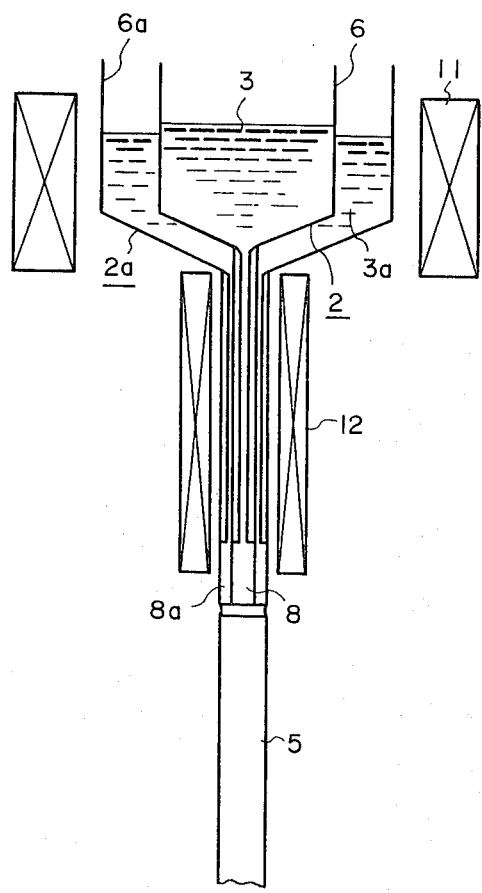

For example, in the case where it is desired to grow the single crystal while at the same time diffusing an impurity, or to vary the composition of the single crystal in its radial direction when forming the single crystal of two or more components, it is possible to adopt such an arrangement as shown in FIG. 2 which employs a double-structured crucible comprising inner and outer crucibles 2 and 2a respectively provided with raw material melting parts 6 and 6a and in which an impurity source and a mother material or two kinds of raw materials of different compositions 3 and 3a are stored in the crucibles 2 and 2a, respectively. From the nozzles 8 and 8a of the inner and outer crucibles 2 and 2a are respectively supplied the molten liquids 3 and 3a, which are combined to obtain the grown crystal 5.

In the above embodiments, when it is necessary to further increase the temperature gradient in the solid-liquid interface, it is also possible to employ a cooling liquid or like means for cooling the grown crystal.

A feature of the present invention is to supply the molten liquid to the solid-liquid interface of the single crystal by gravity instead of the capillary action. This eliminates the necessity of taking into consideration the wetting property of the materials of the molten liquid and the die, unlike in the prior art. Accordingly, the requirement for the combination of the material of the crucible (the raw material melting part 6, the capillary tube part 7 and the nozzle part 8) and the molten liquid in the device of the present invention is that they do not chemically react with each other. By using, as the crucible material, gold, platinum, silver or the like which is inert chemically, such a requirement is fulfilled with respect to almost all materials which have been difficult to use in the prior art, such as halides, chalcogenides, oxides and so forth.

Another feature of the present invention resides in that the temperature in the vicinity of the solid-liquid interface where the crystal is grown can be controlled by the small-diameter heater for the nozzle temperature control use independently of the heater for melting the raw material. This enables the provision of a steep thermal gradient in the neighborhood of the solid-liquid interface, permitting rapid crystal growth.

As still another feature of the present invention, the flow quantity of the molten liquid can be set to a proper value by a suitable selection of the inner diameter and length of the capillary tube part 7 for defining the flow quantity of the molten liquid. Accordingly, it is possible to make a crucible corresponding to any crystal growth rate and the crystal growth rate is not limited by the amount of the molten liquid supplied.

Figure 3:
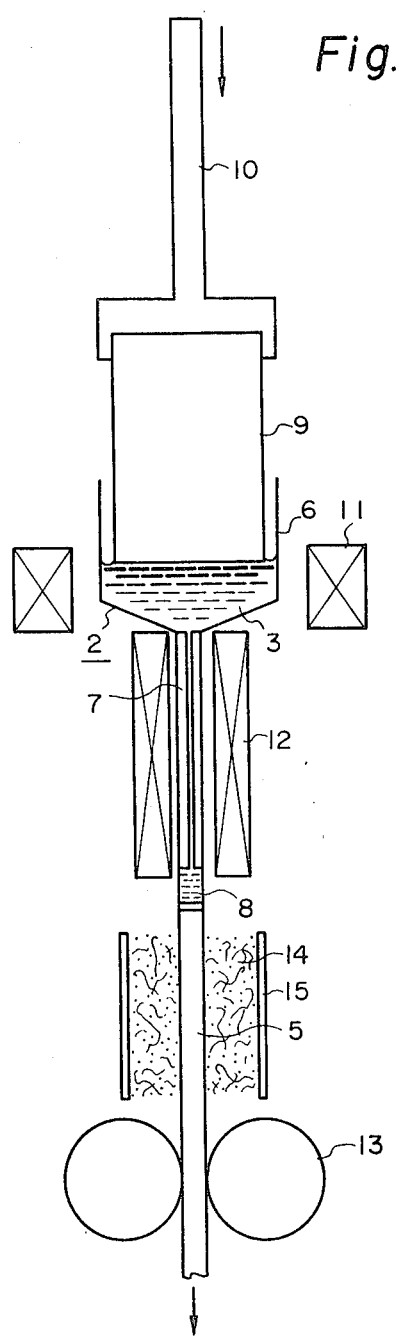

As another feature of the present invention, there is provided, between the nozzle 8 and the rollers 13, a guide pipe 15 filled with fibrous material 14, such as fibers of glass, $Al_2O_3$, or carbon, as shown in FIG. 3. The grown crystal 5 is pulled down by the rollers 13 through the fibrous material 14.

In general, the viscosity of the molten liquid 3 is very small, and the adhesive property acting at the solid-liquid interface between the molten liquid 3 and the grown crystal 5 is extremely small. If a small force is applied to the growth crystal 5 in a direction other than the grown direction, since the liquid 3 and the crystal 5 will be apart or displaced from each other at the interface, a deformation will be caused on the grown crystal 5 at the displaced interface. Accordingly, in order to continuously and smoothly grow the crystal 5, a guide is essential to support the grown crystal 5 so that the crystal 5 will not be pulled at the solid-liquid interface in a direction other than the growth axis. This is very important in case of growing in the downward direction because of the bending action of the grown crystal 5 due to the weight of the crystal 5. In this case, a simple pipe of a fixed guide such as a groove is not suitable, since an irregular seed part of the grown crystal 5 must be passed through the pipe until the growth of the crystal 5 can be stably performed at a constant diameter.

In accordance with this invention, such an irregular seed part of the grown crystal 5 can be smoothly passed through the fibrous material 14 in the guide pipe 15. Moreover, any undesirable force acting on the solid-liquid interface when the irregular seed part of the grown crystal 5 passes through the rollers 13 will be effectively decreased by utilization of the elastic force of the glass, $Al_2O_3$ or carbon fibrous material 14. The size and filling amount of the fibrous material 14 and the length of the guide pipe 15 may be suitably determined in consideration of the kind and size, etc. of the grown crystal 5. For example, in case of growing a KRS-5 crystal of 1 mm diameter, a sufficient, effective result was obtained by a guide pipe of 10 cm length and of 10 mm diameter filled with glass fibers. In case of no guide pipe 15 filled with the fibrous material 14, the grown crystal 5 was sometimes meandered.

The guide pipe 15 filled with the fibrous material 14 can be also provided in the embodiment shown in FIG. 2.

As has been described in the foregoing, the single crystal manufacturing device of the present invention can be employed for the manufacture of single crystals of various materials which have been difficult to use in the prior art, such as halides, chalcogenides, oxides and so forth. Further, since the present invention permits rapid crystal growth, it is of great utility when employed for the manufacture of, for example, fibrous or ribbon-like long single crystals.

What we claim is:

1. A single crystal manufacturing device comprising: a crucible having a melting part for holding a molten liquid of a raw material and a gravity fed nozzle part for continuously taking out a predetermined amount of the molten liquid by the action of gravity; first heater means for heating the raw material to melt it in the melting part; second heater means for heating the nozzle part to take out the molten liquid of the raw material from the nozzle part and for providing as large a thermal gradient as possible in the solid-liquid boundary between the molten liquid taken out from the nozzle part and a grown single crystal continuous to the molten liquid, the second heater means being effective for producing the solid-liquid boundary outside of the nozzle part; roller means provided at the lower side of the nozzle part for advancing the grown single crystal; and guide means comprised of a pipe section filled with fibrous material and positioned between the nozzle part and the roller means for guiding the grown single crystal as it advances away from the nozzle part.

2. A single crystal manufacturing device according to claim 1, wherein the crucible is double-structured and comprised of a pair of melting parts for holding molten liquid therein and for isolating the respective molten liquids held within said pair of melting parts from each other, and a pair of nozzle parts each in communication with a respective one of said melting parts for taking out the respective molten liquids held within said melting parts, whereby said pair of nozzle parts are positioned adjacent each other and oriented so that the grown single crystal is comprised of both respective materials held within said pair of melting parts.

* * * * *